United States Patent [19]
Harvey

[11] Patent Number: 5,952,670
[45] Date of Patent: Sep. 14, 1999

[54] ANTI-WAFER BREAKAGE DETECTION SYSTEM

[75] Inventor: Danial D. Harvey, Andover, Minn.

[73] Assignee: Cypress Semiconductor Corp., San Jose, Calif.

[21] Appl. No.: 09/057,783

[22] Filed: Apr. 9, 1998

[51] Int. Cl.⁶ .................................................. G01N 21/86
[52] U.S. Cl. .............................. 250/559.29; 250/559.12; 414/935
[58] Field of Search ........................... 250/559.29, 559.3, 250/559.12, 559.43, 221, 222.1, 223 R; 414/935, 937, 940, 331

[56] References Cited

U.S. PATENT DOCUMENTS

| | | | |
|---|---|---|---|
| 3,902,615 | 9/1975 | Levy et al. ............................... | 214/301 |
| 4,713,551 | 12/1987 | Layman et al. .......................... | 250/561 |
| 4,770,590 | 9/1988 | Hugues et al. ........................... | 414/172 |
| 4,813,732 | 3/1989 | Klem ........................................ | 294/103.1 |
| 5,044,752 | 9/1991 | Thurfjell et al. ......................... | 356/400 |
| 5,292,222 | 3/1994 | Malagrino et al. ...................... | 414/786 |
| 5,319,216 | 6/1994 | Mokuo et al. ........................... | 250/561 |
| 5,354,995 | 10/1994 | Endo et al. .......................... | 250/559.29 |
| 5,466,945 | 11/1995 | Brickell et al. ..................... | 250/559.12 |
| 5,485,759 | 1/1996 | Goff et al. ............................. | 73/865.9 |
| 5,664,254 | 9/1997 | Ohkura et al. ........................... | 396/612 |
| 5,668,452 | 9/1997 | Villarreal et al. .................. | 318/568.16 |
| 5,700,127 | 12/1997 | Harada et al. ........................... | 414/416 |

*Primary Examiner*—Edward P. Westin
*Assistant Examiner*—Kevin Pyo
*Attorney, Agent, or Firm*—Christopher P. Maiorana; Maiorana & Acosta, P.C.

[57] ABSTRACT

A circuit configured to generate an error signal that may be used to disable a loading mechanism (such as a loading mechanism in a wafer sorter). The circuit comprises a wafer sense circuit configured to generate a first pulse in response to a wafer passing a detection point, a pulse generator circuit configured to generate (i) a second pulse in response to a transition (e.g., a positive transition) of the first pulse and (ii) a third pulse in response to a transition (e.g., a negative transition) of the first pulse. An error detection block may be configured to generate an error signal in response to (i) the first pulse, (ii) the second pulse and (iii) the third pulse.

17 Claims, 6 Drawing Sheets

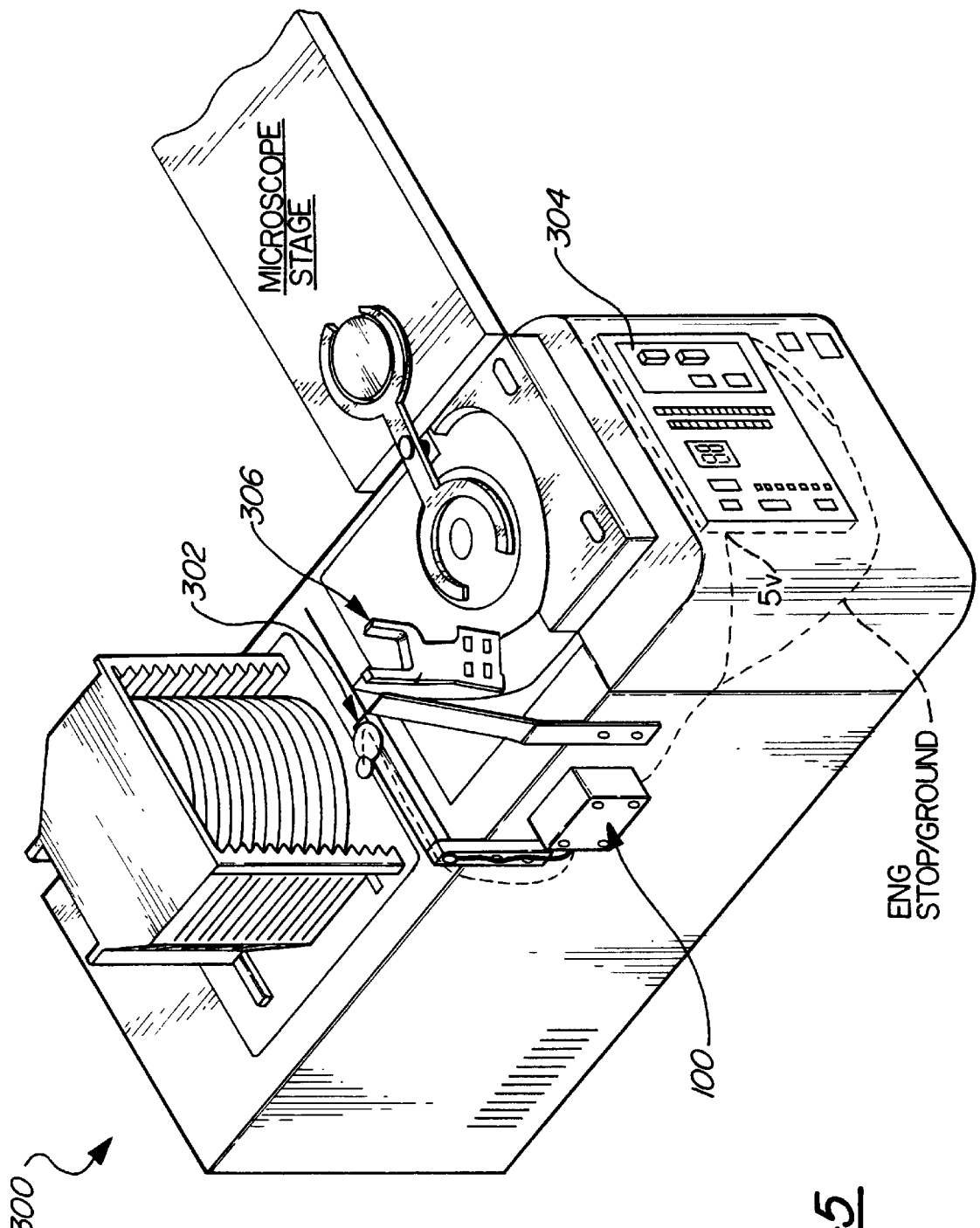

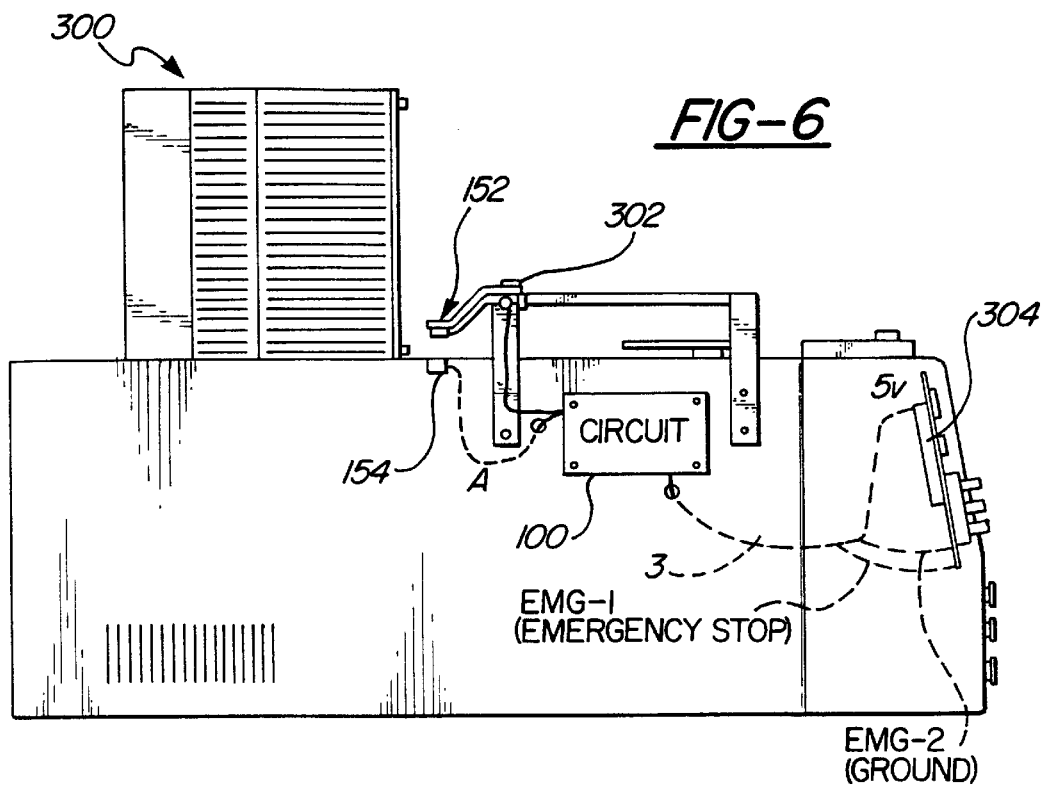
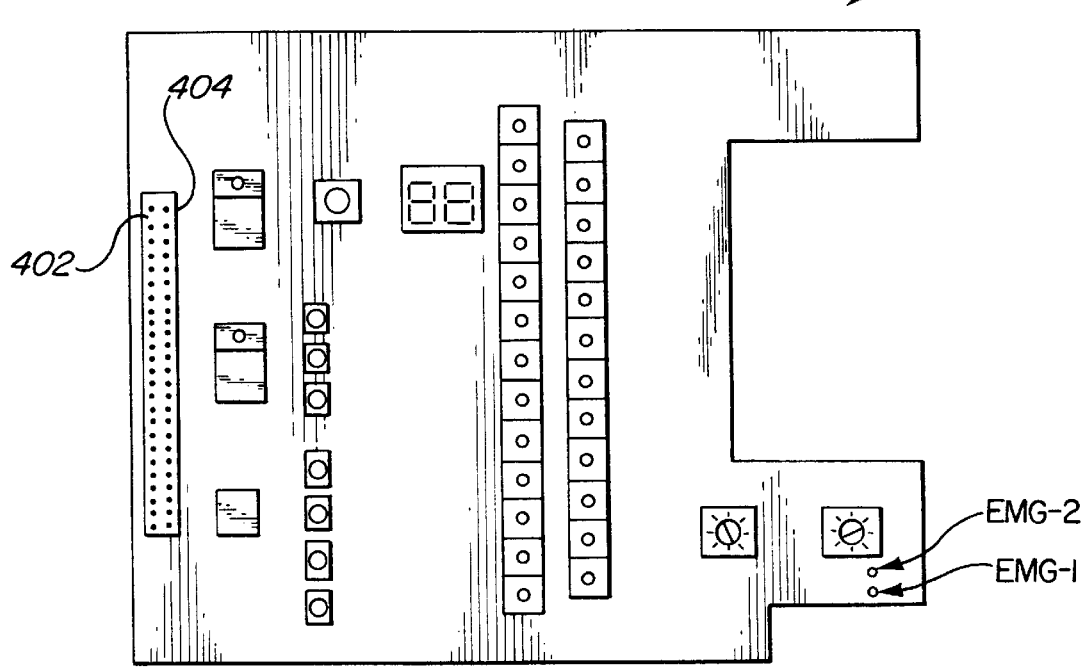

ANTI-WAFER BREAKAGE DETECTION SYSTEM

FIELD OF THE INVENTION

The present invention relates to semiconductor manufacturing generally and, more particularly, to an anti-wafer breakage detection system.

BACKGROUND OF THE INVENTION

Semiconductor manufacturing involves a number of automated systems used to move and transport the semiconductor (generally in the form of a wafer) at various points during the fabrication process. A number of wafers may be transported in cassettes to aid the moving of a large number of wafers at one time. During normal operation of the processing equipment, the cassettes are transported from one location to another. A device called a microscope loader moves a wafer from one location to another and then indexes to the next wafer in the cassette. A problem may occur when the arm fails to place or retrieve a wafer in a proper fashion. This may cause the arm to spill the cassette and/or break the entire contents of the cassette.

In the case of certain commercially available wafer processing machines (e.g., etchers) that include wafer transports (e.g., the wafer loader included in LAM490), wafers occasionally are not fully inserted into the receive cassettes due to cassette misplacement, faulty or misaligned belts etc. A protruding wafer may eventually catch on the edge of the plastic tunnel (e.g., in bulkhead systems). The protruding wafer may break as the cassette indexes or may tip the entire cassette, causing automatic indexing to the top and thus multiple wafer breakage. The same holds true for other commercially available wafer processing machines (e.g., the LAM Rainbows 4400, 4500, and 4600 series, etc.) which have a "pick and place" transport, which does not generally include a belt transport system. Such loaders may be more likely to pull a wafer part of the way back out of the cassette (in the event of the cassette not being properly seated) causing the wafer to catch on the plastic exit load-lock pass-through.

SUMMARY OF THE INVENTION

The present invention concerns a circuit configured to generate an error signal that may be used to disable a loading mechanism (such as a loading mechanism in a wafer sorter). The circuit comprises a wafer sense circuit configured to generate a first pulse in response to a wafer passing a detection point, a pulse generator circuit configured to generate (i) a second pulse in response to a transition (e.g., a positive transition) of the first pulse and (ii) a third pulse in response to a transition (e.g., a negative transition) of the first pulse. An error detection block may be configured to generate an error signal in response to (i) the first pulse, (ii) the second pulse and (iii) the third pulse.

The objects, features and advantages of the present invention include providing a circuit and method for detecting the improper loading or retrieving of a wafer from a cassette in a wafer loading machine and providing a signal to automatically disable the loader arm from further operation until the problem is fixed.

BRIEF DESCRIPTION OF THE DRAWINGS

These and other objects, features and advantages of the present invention will be apparent from the following detailed description and the appended claims and drawings in which:

FIG. 5 is a perspective view of a preferred embodiment of the present invention installed on a typical wafer processing machine;

FIG. 6 is a side view of a preferred embodiment of the present invention installed on a typical wafer processing machine; and FIG. 7 is a diagram of an interface panel of a typical wafer processing machine illustrating input pins that may receive signals from a preferred embodiment of the present invention.

DETAILED DESCRIPTION OF THE PREFERRED EMBODIMENTS

The present invention generally operates by sensing when a wafer passes a certain point. A sensor, such as an emitter/detector configuration or a proximity or reflective type sensor may be used to detect the passing of the wafer. When the wafer passes the sensor, a wafer sense signal may be generated. A positive and negative transition of the wafer sense signal may generate two pulses which generally correspond to time windows. The first time window may represent a time sufficient for the wafer to be placed in a particular destination. The second time window may represent a time during which a second sensing of a wafer should not occur. If the wafer is not placed in a particular destination during the first time window or the wafer is sensed within the second time window, a stop signal may be generated to automatically shut down the wafer loading machine. The use of two time windows generally ensures that the wafers are (i) fully inserted into the cassettes (in the case of belt driven or "Pick and Place" transport applications) and (ii) that the wafers do not get pulled back out of a loaded position (in the case of "Pick and Place" transports where the receive cassette is not properly seated). The present invention may provide a system to prevent wafer breakage in the event of cassettes being accidentally bumped or tipped, which may cause protruding wafers to be damaged by automatic cassette indexing devices.

Figure 1:
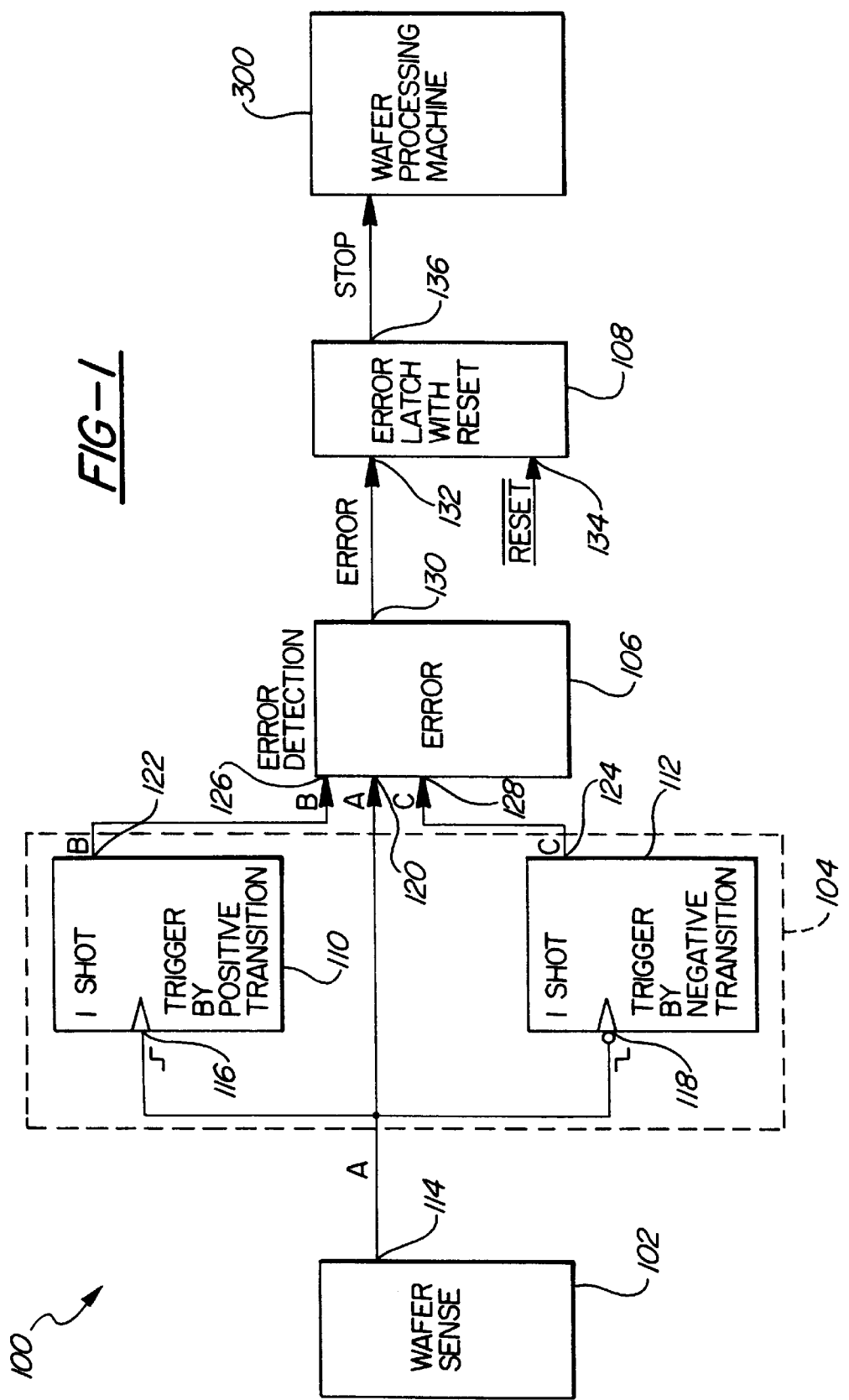
FIG. 1 is a block diagram of a preferred embodiment of the present invention.

Referring to FIG. 1, a block diagram of a circuit 100 is shown in accordance with a preferred embodiment of the present invention. The circuit 100 generally comprises an input block (or circuit) 102, a pulse generator block (or circuit) 104, an error detection block (or circuit) 106, and an output block (or circuit) 108. The pulse generator section 104 generally comprises a pulse generation block (or circuit) 110 and a pulse generation block (or circuit) 112. The input section 102 generally comprises an output 114 that may present signal (e.g., a wafer sense signal) to the pulse generation block 104. The wafer sense signal is generally presented to an input 116 of the pulse generator block 110, to an input 118 of the pulse generator block 112, and to an input 120 of the error detection block 106. The pulse generator 110 generally presents a pulse signal at an output 122 after a transition (e.g., a positive transition) of the signal received at the input 116. The pulse generator 112 generally presents a signal at an output 124 in response to a transition (e.g., a negative transition) of the signal received at the input 118.

The error detection block 106 has an input 126 that generally receives the signal presented at the output 122. Similarly, the error detection block 106 has an input 128 that may receive the signal presented at the output 124. The error detection block 106 has an output 130 that generally presents a signal (e.g., a signal ERROR) in response to the signal received at the inputs 120, 126 and 128.

The output section 108 generally comprises an input 132, an input 134 and an output 136. The input 132 generally receives the signal ERROR and the input 134 generally receives a signal (e.g., a reset signal RESETb) that may be an active low signal. The output section 108 generally presents a signal at the output 136 (e.g., an automatic shut-down signal STOP) configured to automatically stop movement of the microscope loader or other wafer transport mechanism 300. The signal STOP generally continues to be asserted until a reset signal (e.g., RESET) is presented to the input 134. As a result, the output section 108 generally continues to assert the signal STOP until the signal RESET is asserted, which prevents damage to misplaced or misaligned wafers from movement of the wafer transport devices. The signal STOP may be presented to the wafer processing machine 300, which automatically stops the operation of the machine.

Figure 2:
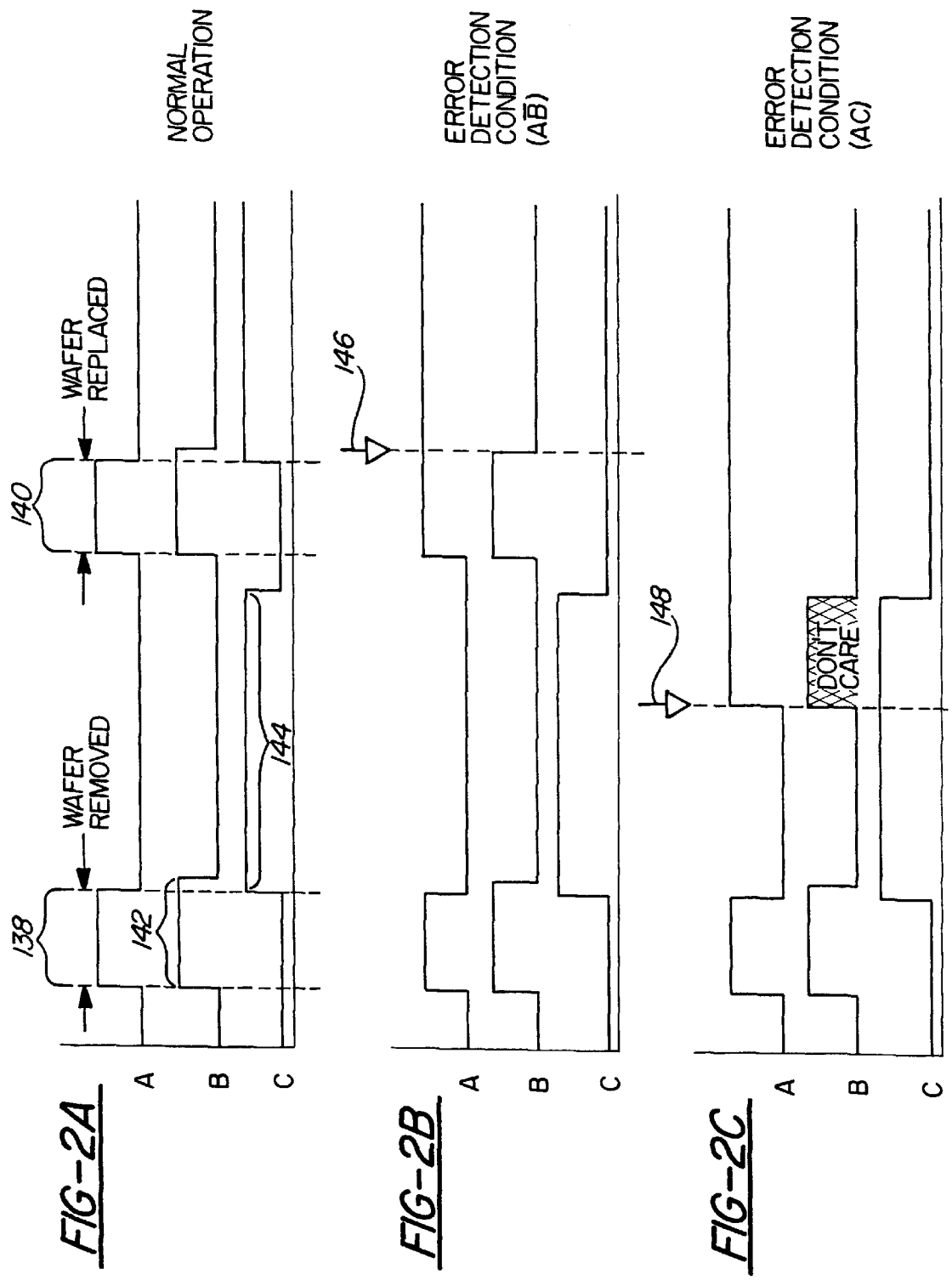
FIG. 2a, 2b, and 2c are timing diagrams of the various waveforms of the present invention.

Referring to FIGS. 2a, 2b and 2c, a number of timing diagrams are shown illustrating the operation of the circuit of FIG. 1. Each of the waveforms illustrate the signals presented from the output 114 (e.g., the signal A or the wafer detection signal), the output 122 (e.g., the signal B) and the output 124 (e.g., the signal C). The waveforms shown in FIG. 2a illustrate a normal operation of the circuit 100. A time window 138 and a time window 140 generally indicate when the wafer is removed and replaced, respectively. The signal B is shown to transition high following the positive transition of the signal A at the beginning of the time window 138. The signal B generally remains high for a predetermined period defining a time window 142. The signal C is shown transitioning high after a negative transition of the signal A. The signal C generally remains high for a time defining a time window 144.

FIG. 2b illustrates an error condition which may occur when the signal A remains high at a time 146. This may occur when the wafer is not replaced within a predetermined time. When the signal A remains high while the signal B is low, the error signal ERROR (to be defined in TABLE 1) is generally generated. Referring to FIG. 2c, the error signal ERROR is shown where the signal A is high at the same time the signal C is high. This may indicate that the wafer has been sensed at an impropoer time. When either of the conditions of FIG. 2b or 2c occur, the error signal ERROR is generally presented at the output 130. The logic of the error detection block 106 may be defined by the following TABLE 1:

TABLE 1

| AB\C | 0 | 1 |
|---|---|---|
| 00 | 0 | 0 |
| 01 | 0 | 0 |
| 11 | 0 | 1 |
| 10 | 1 | 1 |

The headings of the columns generally indicate the state of the signal C, while the headings of the rows generally indicate the states of the signals A and B, respectively. The values in the table generally indicate the state of the error signal ERROR. For example, when the signal A is high while the signal B is low, the error signal ERROR is asserted (shown as a digital "1"), regardless of the state of the signal C. The length of the time windows 142 and 144 may be adjusted to meet the design criteria of a particular application.

In general, the wafer is sensed by the wafer sense circuit 102 which generates the signal A. The pulse generation block 110 generates the signal B in response to the signal A. The pulse generation block 112 generates the signal C in response to the signal A. The error detection block 106 generates the signal ERROR in response to the signals A, B, and C when the wafer is not placed in the proper position within the first predetermined time window or is sensed again within the second predetermined time window. The output block 108 generates the signal STOP in response to the signal ERROR. The signal STOP is generally a latched version of the signal ERROR. The signal STOP generally causes a wafer processing machine to automatically stop operation until a reset signal is received. The reset signal is generally presented after the problem with the wafers has been fixed.

Figure 3:
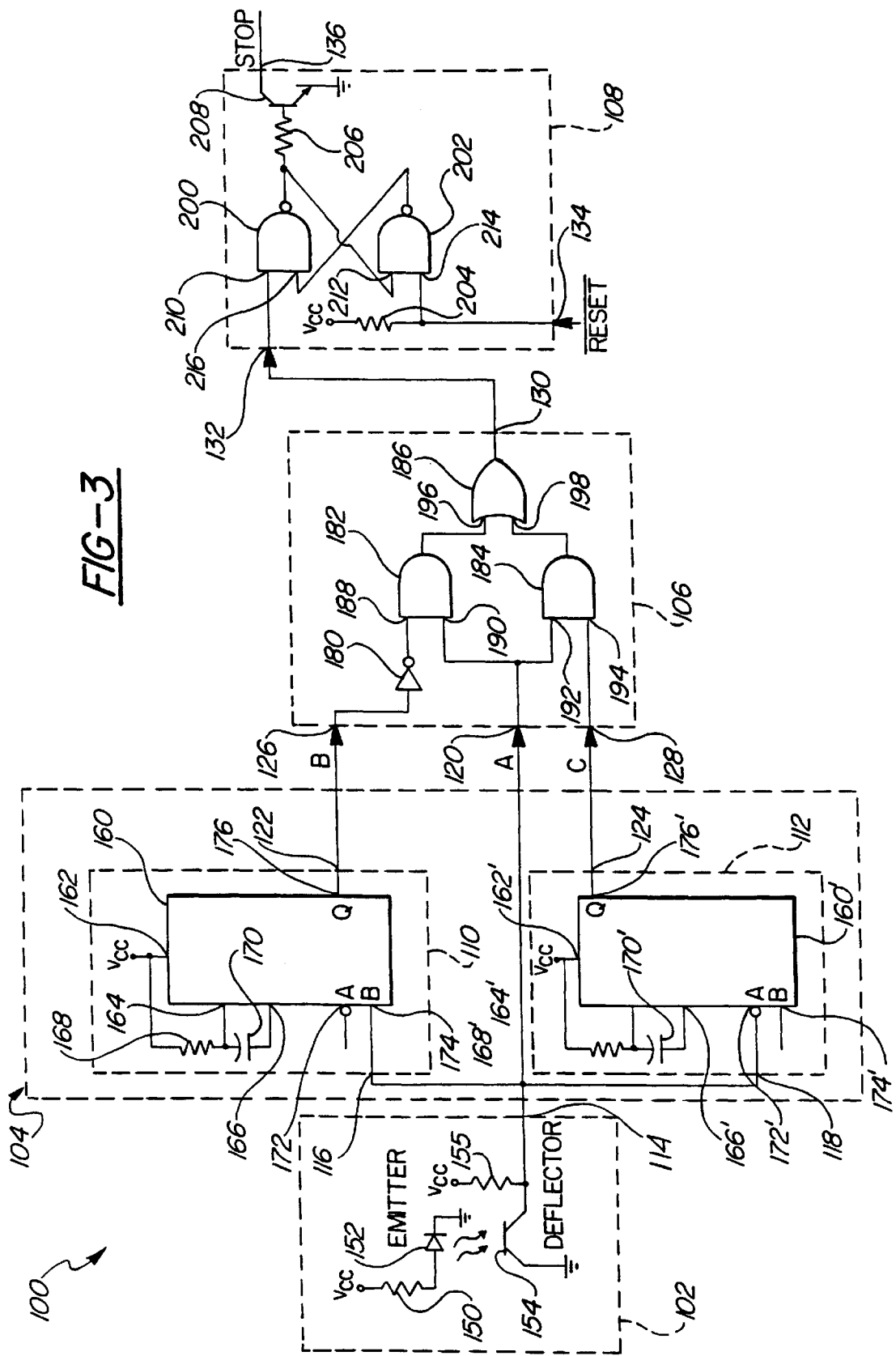
FIG. 3 is a circuit diagram of a preferred embodiment of the present invention.

Referring to FIG. 3, a more detailed diagram of the circuit 100 is shown. The input section 102 generally comprises a resistor 150, a LED 152 (or other light emitter), a photo detector 154, and a resistor 155. The resistor 150 and the resistor 155 may be optional components. An input supply voltage (e.g., Vcc) may be presented to a first side of the LED 152 through the resistor 150. A second side of the LED 152 may be coupled to ground. The photo detector (e.g., a photo transistor) 154 generally comprises an emitter that may be coupled to ground and a collector that may be coupled to the output 114. An input supply voltage (e.g., Vcc) may be coupled (through the resistor 155) to the output 114, as well as to the collector of the photo detector 154. The base of the photo detector 154 generally detects light received from the LED 152. In a preferred embodiment of the present invention, the input section 102 may be mounted to the microscope loader (e.g., to the chassis of the loader).

The pulse generator 110 is shown generally implemented as a one-shot device circuit 160 (e.g., a 74221 is one example of such a one-shot). However, other devices capable of generating a pulse having a predetermined width may be implemented accordingly to meet the design criteria of a particular application. The circuit 160 is shown having inputs 162, 164, and 166 that each receive a version of an input supply voltage (e.g., Vcc). The input supply voltage is generally presented to the input 162, to the input 164 through a resistor 168, and to the input 166 through both the resistor 168 and the capacitor 170. The circuit 160 also comprises a negative transition detecting input 172, a positive transition detecting input 174, and an output 176. Since the pulse generator 110 generally presents an output pulse on the positive transition of the signal received at the input 116, the input 116 is generally presented to the input 174. The pulse generator 112 generally has similar features as the pulse generator 110, which may be indicated with the primed reference numbers. Since the pulse generator 112 generates a pulse on a negative transition of the signal received at the input 118, the signal received at the input 118 is generally presented to the input 172'. The logic levels of each of the signals A, B and C presented to the error detection block may be adjusted to accommodate alternate logic (such as logic to be described in connection with FIG. 4) to meet the design criteria of a particular application.

The error detection block 106 generally comprises an inverter 180, an AND gate 182, an AND gate 184, and an OR gate 186. The signal B may be received at the input 126 is generally presented to an input 188 of the AND gate 182 through the inverter 180. The signal A may be received at the input 120 and is generally presented to an input 190 of the AND gate 182 as well as to an input 192 of the AND gate 184. The signal C may be received at the input 128 is generally presented to an input 194 of the AND gate 184. The AND gate 182 generally presents a signal to an input 196 of the OR gate 186 while the AND gate 184 generally presents a signal to an input 198 of the OR gate 186. The OR gate 186 generally presents a signal at the output 130.

The output section 108 generally comprises a NAND gate 200, a NAND gate 202, a resistor 204, a resistor 206 and a transistor 208. The signal received at the input 132 is generally presented to an input 210 of the NAND gate 200. The output of the NAND gate 200 is generally presented to an emitter of the transistor 208, through the resistor 206, as well as to an input 212 of the NAND gate 202. The NAND gate 202 also has an input 214 that generally receives the signal RESET from the input 134 as well as (through the resistor 204) a supply voltage (e.g., Vcc). An output of the NAND gate 202 may be presented to an input 216 of the NAND gate 200. The NAND gate 200 and the NAND gate 202 generally form a latch that holds the signal presented at the output 136 to a particular value until the signal RESET received at the input 134 is asserted.

Figure 4:
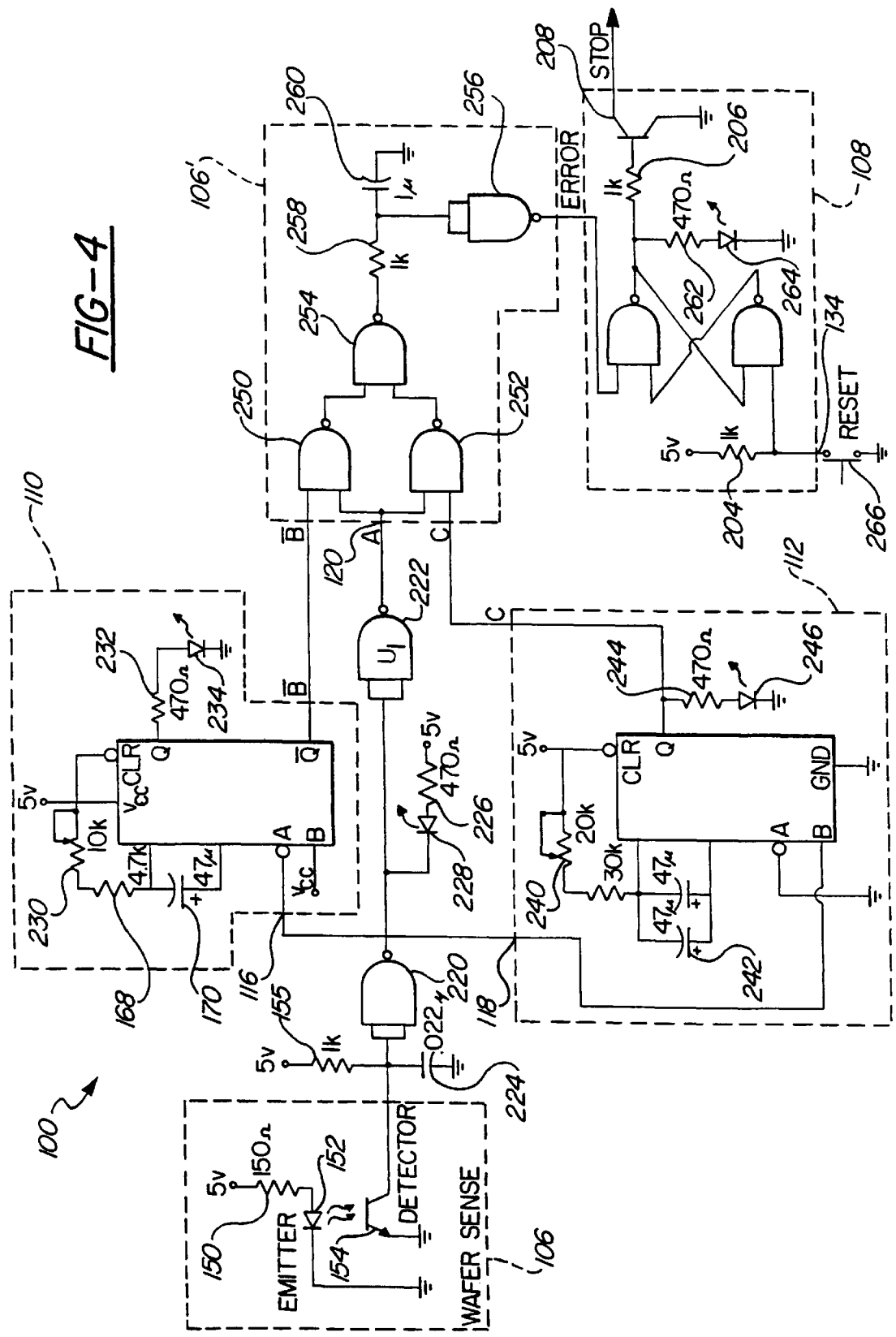
FIG. 4 is a more detailed circuit diagram of a preferred embodiment of the present invention.

Referring to FIG. 4, a more detailed circuit diagram of the circuit 100 is shown illustrating a number of exemplary values for the various components of the circuit 100 along with various additional components. The exemplary values are used to illustrate one implementation of the circuit 100. Other implementations may be implemented accordingly to meet the design criteria of a particular application. Specifically, the particular values of the resistors, capacitors etc., may be adjusted accordingly to meet particular design criteria (e.g., the length of the various time windows, etc,).

The circuit 100 further comprises a NAND gate 220, a NAND gate 222, a capacitor 224, a resistor 226, and an LED 228. The resistor 155 is shown coupled between an input supply voltage (e.g., 5V) and the inputs of the NAND gate 220. The capacitor 224 is generally coupled between the inputs of the NAND gate 220 and ground. The NAND gate 220 presents a signal to the input 116, the input 118, the inputs of the NAND gate 222 and a supply voltage (e.g., 5V through the LED 228 and the resistor 226). The LED 228 generally provides a visual indication of when the signal A is high. The NAND gate 222 presents the signal A to the input 120 of the error detection circuit 106. The pulse generation block 110 is shown further including a variable resistor 230, a resistor 232, and a LED 234. The variable resistor 230 generally provides flexibility in programming the length of time the pulse B is in a particular state (e.g, high state). The resistor 232 and the LED 234 generally provide a visual indication of when the pulse B is active. The pulse generator block 112 further includes a variable resistor 240, a capacitor 242, a resistor 244 and a LED 246. The resistor 244 and the LED 246 generally provide a visual indication of when the signal C is in a high state. The variable resistor 240 generally allows for the adjustment of the time window 144 of the signal C. The addition of the capacitor 242 generally provides a longer time window when compared with the time window 142 of the pulse generator 110.

The error detection block 106 is shown implemented with NAND gates 250, 252, 254, 256, a resistor 258 and a capacitor 260. The resistor 258 and the capacitor 260 generally provide filtering of transient spikes that may be present on the error signal ERROR. The logic of the modified error detection block 106' generally accommodates the signal Bb presented from the pulse generator block 110. The output section 108 further includes a resistor 262 and a LED 264 which may provide a visual indication of when the stop signal is asserted. The output signal (e.g., RESET) presented to the input 134 is shown connected through a switch 266.

Referring to FIG. 5, a perspective view of the circuit 100 is shown installed on a typical wafer processing machine 300. The wafer processing machine generally comprises a sensor bracket 302, an interface panel 304 and a wafer transport arm 306. The circuit 100 generally receives the signal A from a sensor mounted to the sensor bracket 302. The circuit 100 generally presents the signal STOP to a control circuit mounted in the interface panel 304.

Referring to FIG. 6, a side view of the circuit 100 installed on a typical wafer processing machine 300 is shown. The emitter 152 is shown mounted on the sensor bracket 302. The detector 154 is shown presenting the signal A to the circuit 100. The circuit 100 is shown presenting a multi-bit bus (including the signal STOP) to the interface panel 304. The interface panel 304 generally has an input to receive an emergency stop signal, a line to provide a ground and a line to provide a supply voltage (e.g., Vcc or 5V). The inputs are described in more detail in connection with FIG. 7. A typical wafer processing machine 300 generally includes an input that provides an emergency stop of the machine. By supplying the emergency stop signal with the circuit 100, an automatic shut-off of the wafer processing machine 300 generally occurs during the condition that occurs during a wafer misplacement. The automatic shut-off generally eliminates human error that may arise if the machine operator is not aware of the wafer misplacement or otherwise inadvertently fails to stop the machine 300 during a wafer misplacement.

FIG. 7 is a diagram of a circuit board 400 located in an interface panel 304 of a typical wafer processing machine 300. The circuit board generally comprises an input EMG1 that provides an emergency stop of the machine 300 when activated. The input EMG1 generally receives the signal STOP from the circuit 100. A pin EMG2 generally provides a ground. A pin 402 and a pin 404 may provide an input supply voltage (e.g., 5V).

While the invention has been particularly shown and described with reference to the preferred embodiments thereof, it will be understood by those skilled in the art that various changes in form and details may be made without departing from the spirit and scope of the invention.

I claim:

1. A circuit comprising:

a first circuit configured to generate a first pulse in response to a wafer passing a detection point;

a second circuit configured to generate (i) a second pulse representing a first time window in response to a first transition of the first pulse and (ii) a third pulse representing a second time window in response to a second transition of the first pulse; and a third circuit configured to generate an error signal in response to (i) said first pulse, (ii) said second pulse and (iii) said third pulse, wherein said error signal has an active state corresponding to said wafer remaining in or at said detection point for a time greater than said first time window or is in or at said detection point during said second time window, said active error signal automatically disabling a wafer loading mechanism or transport mechanism or device.

2. The circuit according to claim 1, wherein said first transition comprises a positive transition of the first pulse.

3. The circuit according to claim 1, wherein said first transition comprises a negative transition of the first pulse.

4. The circuit according to claim 1, wherein said second transition comprises a positive transition of the first pulse.

5. The circuit according to claim 1, wherein said second transition comprises a negative transition of the first pulse.

6. The circuit according to claim 1, wherein the first circuit comprises an emitter and a detector configured to present said first pulse when a wafer passes between the detector and the emitter.

7. The circuit according to claim 1, wherein said first circuit comprises a light emitting diode (LED) and a detector configured to present said first pulse when said wafer passes between the LED and the detector.

8. The circuit according to claim 1, wherein said first circuit comprises a proximity detector configured to present said first pulse when said wafer passes within a predetermined distance of said proximity detector.

9. The circuit according to claim 1, wherein said first circuit comprises a light emitting diode (LED) and a reflector configured to present said first pulse when said wafer passes between said LED and said reflector.

10. The circuit according to claim 1, wherein said first circuit comprises an emitter and a detector configured to present said first pulse when said wafer passes said emitter and said detector.

11. The circuit according to claim 10, wherein said emitter comprises a reflective sensor.

12. The circuit according to claim 1, wherein said second circuit further comprises a first and second pulse generator.

13. The circuit according to claim 1, further comprising a fourth circuit configured to hold said error signal until a reset condition is received.

14. An apparatus comprising:

means for generating a first pulse in response to a wafer passing a detection point;

means for generating (i) a second pulse representing a first time window in response to a first transition of the first pulse and (ii) a third pulse representing a second time window in response to a second transition of the first pulse; and means for generating an error signal in response to (i) said first pulse, (ii) said second pulse and (iii) said third pulse, wherein said error signal has an active state corresponding to said wafer remaining in or at said detection point for a time greater than said first time window or is in or at said detection point during said second time window, said active error signal automatically disabling a wafer loading mechanism or transport mechanism or device.

15. The apparatus according to claim 14, further comprising:

means for holding said error signal until a reset condition is received.

16. A method for disabling a loading mechanism comprising the steps of:

generating a first pulse in response to a wafer passing a detection point;

generating (i) a second pulse representing a first time window in response to a first transition of the first pulse and (ii) a third pulse representing a second time window in response to a second transition of the first pulse; and generating an error signal in response to (i) said first pulse, (ii) said second pulse and (iii) said third pulse, wherein said error signal has an active state corresponding to said wafer remaining in or at said detection point for a time greater than said first time window or is in or at said detection point during said second time window, said active error signal automatically disabling a wafer loading mechanism or transport mechanism or device.

17. The method according to claim 16, further comprising the step of:

holding said error signal until a reset signal is received.

* * * * *